United States Patent [19]
Shinozaki et al.

[11] Patent Number: 6,022,413
[45] Date of Patent: Feb. 8, 2000

[54] THIN-FILM VAPOR DEPOSITION APPARATUS

[75] Inventors: Hiroyuki Shinozaki, Fujisawa; Yukio Fukunaga, Yokohama; Takeshi Murakami, Tokyo; Kiwamu Tsukamoto, Fujisawa, all of Japan

[73] Assignee: Ebara Corporation, Tokyo, Japan

[21] Appl. No.: 08/664,544

[22] Filed: Jun. 17, 1996

[30] Foreign Application Priority Data

| Jun. 16, 1995 | [JP] | Japan | 7-174337 |
| Jun. 16, 1995 | [JP] | Japan | 7-174338 |
| Jun. 16, 1995 | [JP] | Japan | 7-174339 |

[51] Int. Cl.[7] ............ C23C 14/00; C23C 16/00
[52] U.S. Cl. ............ 118/715; 118/725; 118/730
[58] Field of Search ............ 118/723, 715, 118/730

[56] References Cited

U.S. PATENT DOCUMENTS

| 4,869,801 | 9/1989 | Helms et al. | 204/298 |
| 4,902,531 | 2/1990 | Nakayama et al. | 427/39 |
| 5,063,031 | 11/1991 | Sato . | |
| 5,270,600 | 12/1993 | Hashimoto | 310/75 |
| 5,273,588 | 12/1993 | Foster et al. | 118/723 |
| 5,279,084 | 1/1994 | Atsukawa | 52/118 |
| 5,626,782 | 5/1997 | Maeda | 219/449 |
| 5,683,518 | 11/1997 | Moore et al. | 118/730 |
| 5,728,223 | 3/1998 | Murakami | 118/715 |

FOREIGN PATENT DOCUMENTS

| 44 28 992 | 3/1995 | Germany . |
| 7-58036 | 3/1995 | Japan . |
| 2 218 316 | 8/1989 | United Kingdom . |
| 93/25723 | 12/1993 | WIPO . |

OTHER PUBLICATIONS

Patent Abstracts of Japan, vol. 016, No. 084 (E–1172), Feb. 28, 1992 & JP–A–03 270012 (Fujitsu Ltd; Others: 01), Dec. 2, 1991 *abstract*.

Patent Abstracts of Japan, vol. 009, No. 230 (E–343), Sep. 17, 1985 & JP–A–60 086821 (Hitachi Seisakusho KK; Others: 01), May 16, 1985 *abstract *.

Journal of Crystal Growth, Feb. 1994, Netherlands, vol. 135, No. 3–4, ISSN 0022–0248, pp. 383–400, XP000484431, Anderson P.L. ET Al: "A high–speed, rotating–disc metalorganic chemical vapor deposition system for the growth of (Hg,Cd) Te and related alloys"*the whole document*.

U.S. application No. 08/662,763, filed Jun. 10, 1996, entitled "Reactant Gas Ejector Head and Thin–Film Vapor Deposition Apparatus", by Takeshi Murakami et al.

*Primary Examiner*—Bruce Breneman
*Assistant Examiner*—Alva C Powell
*Attorney, Agent, or Firm*—Wenderoth, Lind & Ponack, L.L.P.

[57] ABSTRACT

A thin-film vapor deposition apparatus has a reaction chamber for holding therein a substrate in an atmosphere isolated from an ambient atmosphere. For depositing a thin film on the substrate, the temperature of an inner wall of the reaction chamber is adjusted to control the temperature of the atmosphere in the reaction chamber, and the temperature of the substrate is also adjusted independently of the temperature of the atmosphere in the reaction chamber, while the substrate is being rotated at a high speed in the reaction chamber. Reactant gases required to deposit a thin film on the substrate are ejected from a reactant gas elector head toward the substrate in the reaction chamber. Remaining and excessive gases are discharged out of the reaction chamber.

12 Claims, 6 Drawing Sheets

THIN-FILM VAPOR DEPOSITION APPARATUS

BACKGROUND OF THE INVENTION

1. Field of the Invention

The present invention relates to a thin-film vapor deposition apparatus, and more particularly to a thin-film vapor deposition apparatus suitable for depositing in a vapor or gas phase a thin film of a high dielectric constant such as barium/strontium titanate.

2. Description of the Prior Art

In recent years, there have been increasing efforts in the semiconductor industry to increase the degree of integration of integrated circuits. Such efforts are directed to, among others, the research and development of DRAMs (Dynamic Random-Access Memories) ranging from present megabit storage capabilities to future gigabit storage capabilities. For producing such DRAMs, it is necessary to provide devices having large storage capabilities. In an attempt to produce dielectric thin films for use in such large storage capability devices, researchers have been shifting their attention from silicon oxide films and silicon nitride films whose dielectric constants are 10 or less to more promising thin film metal oxide materials including tantalum pentoxide ($Ta_2O_5$) whose dielectric constant is about 20, and barium titanate ($BaTiO_3$), strontium titanate ($SrTiO_3$), and mixtures of barium/strontium titanate whose dielectric constants are about 300.

However, the vapor deposition of a thin film of such a high dielectric constant material prevent a manufacturing problem in that the rate of film deposition is lower than that of conventional thin films. Japanese laid-open patent publication No. 7-58036 discloses a thin-film vapor deposition apparatus which has been proposed to solve such a problem. The disclosed thin-film vapor deposition apparatus has a reaction chamber which develops therein an atmosphere different from the ambient atmosphere, a susceptor rotatably disposed in the reaction chamber for supporting a substrate on which a thin film will be formed, a levitating mechanism having a magnetic bearing for lifting the susceptor, and an actuator mechanism for rotating the susceptor at high speed. The susceptor is levitated by the levitating mechanism with magnetic bearings. Since a no contact-type bearing is used to support the susceptor, the rotational speed of the susceptor can be increased freely insofar as it is permitted by the strength of the susceptor to withstand centrifugal forces applied thereto. The susceptor is specifically rotatably supported by a motor, which is combined with magnetic bearings, having a solid rotor. The susceptor has a heater and a chuck mechanism, and also includes a slip ring for supplying electric energy thereto.

The vapor deposition of a thin film of a high dielectric constant material is characterized in that a material gas in a vapor phase should be kept in a very narrow, high temperature range. When the above conventional thin-film vapor deposition apparatus is employed to deposit a thin film of a high dielectric constant material, if there are undue temperature irregularities in the reaction chamber, then the material tends to be separated out, contaminating the reaction chamber, or resulting in an wasteful consumption of the material and a lowered yield.

Furthermore, since the susceptor and the heater rotate integrally with each other, the motor is subject to a large load and cannot easily be controlled. The heater is apt to deteriorate soon and its maintenance cycle is short because the heater is exposed at all times to the atmosphere in the reaction chamber. The solid rotor is heavy for its required level of mechanical strength, and cannot easily be controlled because it is likely to vibrate in a certain vibration mode. Inasmuch as the slip ring for supplying electric energy is liable to wear quickly, it tends to cause a failure and make the supply of electric energy unstable.

In the conventional thin-film vapor deposition apparatus, the temperature of the atmosphere in the reaction chamber and the temperature of the substrate have to be strictly controlled separately from each other. Since the reaction chamber incorporates temperature control means for separately controlling the temperatures, the reaction chamber is relatively complex in structure, leaving a comparatively low degree of freedom as to the designing of a feed path for loading and unloading substrates and a robot arm for guiding a substrate through the feed path to place the substrate on or remove the substrate from the susceptor.

In the conventional thin-film vapor deposition apparatus, furthermore, because the substrate is heated through the susceptor, the temperature of the substrate cannot quickly be changed. Consequently, even when the temperature of the substrate is detected as being improper, the temperature of the substrate cannot quickly be controlled to its appropriate value. As a result, desirable reactive conditions may not be established.

SUMMARY OF THE INVENTION

It is therefore an object of the present invention to provide a thin-film vapor deposition apparatus which is capable of depositing a high-quality thin film of a high dielectric constant material efficiently under stable temperature and operating conditions.

Another object of the present invention is to provide a thin-film vapor deposition apparatus which is capable of depositing a thin film of a high dielectric constant material under stable conditions and also of easily moving a substrate into and out of a reaction chamber for efficient film deposition.

Still another object of the present invention is to provide a thin-film vapor deposition apparatus which is capable of quickly controlling the temperature of a substrate for depositing a thin film of a high dielectric constant material under desirable conditions.

According to a first aspect of the present invention, there is provided a thin-film vapor deposition apparatus comprising a reaction chamber for holding therein a substrate in an atmosphere isolated from an ambient atmosphere, reaction chamber temperature control means for adjusting the temperature of an inner wall of said reaction chamber to control the temperature of the atmosphere in the reaction chamber, substrate rotating means for rotating the substrate at a high speed in said reaction chamber, substrate temperature control means for controlling the temperature of the substrate, reactant gas supply means for ejecting reactant gases required to deposit a thin film on the substrate toward the substrate, and discharge means for discharging gases out of said reaction chamber. While the temperature of the atmosphere in the reaction chamber is being controlled by the reaction chamber temperature control means and also the temperature of the substrate is being controlled by the substrate temperature control means, the substrate is rotated at a high speed by the substrate rotating means, and the reactant gases are ejected toward the substrate. Therefore, a high-quality thin film of a high dielectric constant material can smoothly and accurately be deposited on the substrate, even though such a high dielectric constant material in a vapor phase needs to be kept in a very narrow temperature range and the gases react in a narrow temperature range.

In the first aspect of the present invention, the substrate rotating means comprises a motor combined with magnetic bearings, said motor comprising a stator and a hollow rotor rotatably disposed in said stator and having an end projecting into said reaction chamber, further comprising substrate support means mounted on said end of the rotor for supporting the substrate. The motor combined with magnetic bearings is effective to magnetically levitate the substrate support means for allowing the substrate to rotate smoothly at high speed. Since the rotor is hollow, the load on the motor is minimal, and the rotor can easily be controlled as to its position, attitude, and rotational speed.

In the first aspect of the present invention, the substrate temperature control means comprises a column extending through said hollow rotor and a heater mounted on an end of said column in confronting relationship to the substrate. The heater and a temperature sensor therefor are mounted on the end of the column which extends through the hollow rotor. Therefore, the heater and the temperature sensor are separate from the substrate rotating means, and are not required to rotate in unison with the substrate. In addition, the heater and the temperature sensor may be sealed in a space below the substrate for minimized exposure to the atmosphere in the reaction chamber.

In the first aspect of the present invention, said substrate support means comprises means for supporting the substrate while at least a portion of a reverse side of the substrate remote from said reactant gas supply means is being exposed. The reverse side of the substrate is exposed to the heater and can directly be heated by the heater. Therefore, the temperature of the substrate can accurately be controlled.

According to a second aspect of the present invention, there is provided a thin-film vapor deposition apparatus comprising a reaction chamber for holding therein a substrate in an atmosphere isolated from an ambient atmosphere, a substrate support member for supporting the substrate in said reaction chamber, reactant gas supply means for ejecting reactant gases required to deposit a thin film on the substrate toward the substrate, discharge means for discharging gases out of said reaction chamber, substrate rotating means for rotating the substrate at a high speed in said reaction chamber, said substrate rotating means having a hollow rotor, and a substrate pusher member disposed in confronting relation to a reverse side of the substrate remote from said reactant gas supply means for pushing the substrate off said substrate support member. While the substrate is being supported by the substrate support member in the reaction chamber whose atmosphere is isolated from an ambient atmosphere and being rotated by the substrate rotating means having the hollow rotor, the reactant gases are ejected toward the substrate by the reactant gas supply means to deposit a thin film on the substrate. Remaining or by-product gases are discharged from the reaction chamber by the discharge means. After the reaction, the substrate pusher member lifts the substrate off the substrate support member. Then, a robot arm is inserted between the substrate and the substrate support member, and carries the substrate out of the reaction chamber. For placing a new substrate in the reaction chamber, the robot arm with the new substrate carried thereon moves to a position above the substrate support member, and the substrate pusher member is lifted to receive the new substrate from the robot arm. Thereafter, the substrate pusher member is lowered to put the substrate on the substrate support member.

In the second aspect of the present invention, the thin-film vapor deposition apparatus further comprises a coupling extending through said hollow rotor, said substrate pusher member being supported on an inner end of said coupling within said reaction chamber, and an actuating mechanism mounted on an outer end of said coupling outside of said reaction chamber for vertically moving said coupling. The substrate pusher member is connected through the hollow rotor to the actuating mechanism, which actuates the substrate pusher member.

In the second aspect of the present invention, the thin-film vapor deposition apparatus further comprises a heater disposed in confronting relation to said reverse side of the substrate, for heating the substrate. The heater disposed in confronting relation to said reverse side of the substrate directly heats the substrate. Since the heater is disposed in confronting relation to said reverse side of the substrate, the heater is not exposed to the reaction which is taking place on the other side of the substrate.

In the second aspect of the present invention, the heater and said substrate pusher member are connected for vertical movement in unison with each other. Because the heater and said substrate pusher member are vertically movable in unison with each other, their structure is relatively simple and they can be moved by a simple mechanism.

In the second aspect of the present invention, the actuating mechanism comprises a feed screw mechanism. The feed screw mechanism allows a relatively small actuator to move the coupling smoothly and reliably. The feed screw mechanism may be replaced with a ball screw mechanism.

In the second aspect of the present invention, the actuating mechanism includes a covering member covering said coupling and flexible upon vertical movement of said coupling, said covering member isolating a space communicating with said reaction chamber from the ambient atmosphere. When the coupling is vertically moved, the covering member flexes while covering the coupling and isolating the space communicating with said reaction chamber from the ambient atmosphere. The covering member may comprise a bellows or the like.

According to a third aspect of the present invention, there is provided a thin-film vapor deposition apparatus comprising a reaction chamber for holding therein a substrate in an atmosphere isolated from an ambient atmosphere, a substrate support member for supporting the substrate in said reaction chamber, reactant gas supply means for ejecting reactant gases required to deposit a thin film on the substrate toward the substrate, discharge means for discharging gases out of said reaction chamber, substrate rotating means for rotating the substrate at a high speed in said reaction chamber, said substrate rotating means having a hollow rotor, and a heater moving mechanism for vertically moving the heater, said heater moving mechanism supporting said heater through said hollow rotor. While the substrate is being supported by the substrate support member in the reaction chamber whose atmosphere is isolated from an ambient atmosphere and being rotated by the substrate rotating means having the hollow rotor, the reactant gases are ejected toward the substrate by the reactant gas supply means to deposit a thin film on the substrate. Remaining or by-product gases are discharged from the reaction chamber by the discharge means. Depending on temperature conditions of the substrate, the heater is vertically moved with respect to the substrate to quickly adjust the temperature of the substrate.

In the third aspect of the present invention, the substrate support member comprises means for supporting the substrate while at least a portion of a reverse side of the substrate remote from said reactant gas supply means is being exposed. The reverse side of the substrate is exposed to the heater and can directly be heated by the heater. Therefore, the temperature of the substrate can accurately be controlled.

In the third aspect of the present invention, the heater moving mechanism comprises a feed screw mechanism. The feed screw mechanism allows a relatively small actuator to move the heater smoothly and reliably.

In the third aspect of the present invention, the heater moving mechanism includes a covering member covering an opening between said hollow rotor and said heater moving mechanism flexible upon vertical movement of said heater, said covering member isolating a space in said hollow rotor from the ambient atmosphere. The covering member is effective in isolating the space in the rotor from the ambient atmosphere, thereby keeping the atmosphere in the reaction chamber.

In the third aspect of the present invention, the thin-film vapor deposition apparatus further comprises reaction temperature adjusting means disposed in said reaction chamber for adjusting the temperature of an inner wall of the reaction chamber. In the reaction chamber, the reaction temperature adjusting means adjust the temperature of the inner wall of the reaction chamber to prevent an unwanted material from being separated from the reactant gases.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Like or corresponding parts are denoted by like or corresponding reference characters throughout views.

Figure 1:
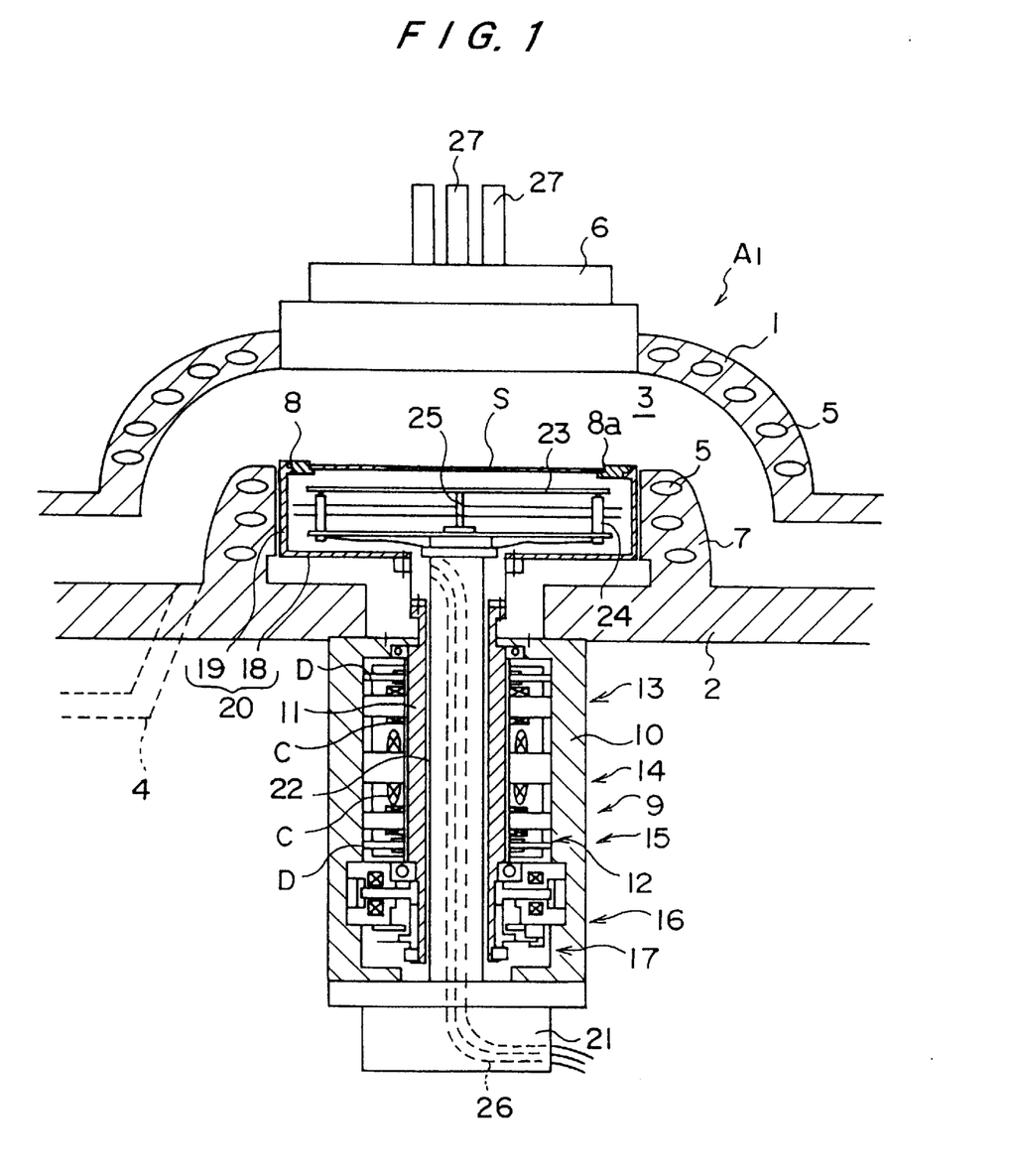
FIG. 1 is a schematic vertical cross-sectional view of a thin-film vapor deposition apparatus according to a first embodiment of the present invention.
Figure 2:
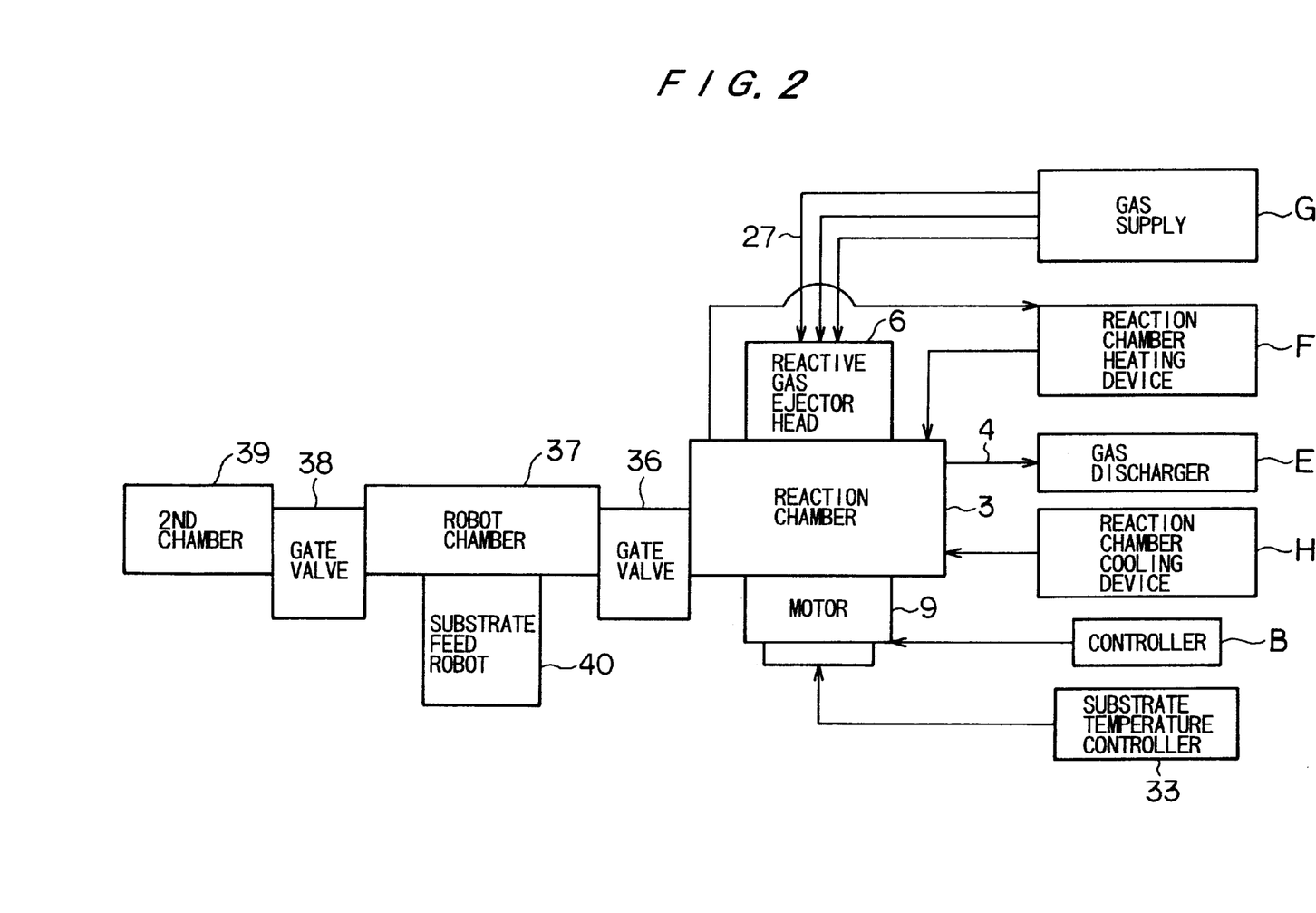
FIG. 2 is a block diagram of the thin-film vapor deposition apparatus according to the first embodiment of the present invention.

FIGS. 1 and 2 show a thin-film vapor deposition apparatus $A_1$ according to a first embodiment of the present invention.

As shown in FIG. 1, the thin-film vapor deposition apparatus $A_1$ has a reaction chamber 3 defined between an inverted-cup shaped reactor 1 and a support base 2 disposed underneath the reactor 1. The reaction chamber 3 is hermetically sealed and has a discharge port 4 for discharging produced gases from the reaction chamber 3. The discharge port 4 is connected to a gas discharger E (see FIG. 2). The reactor 1 has a wall with a heat medium passage 5 defined therein for circulating a heat medium therethrough to keep the reactor wall and the reaction chamber 3 at a predetermined temperature. The heat medium passage 5 is connected to a reaction chamber heating device F (see FIG. 2). The heat medium passage 5 has a thermocouple and a flow regulating valve which are disposed therein. Based on a temperature measured by the thermocouple, the flow regulating valve is adjusted to control the rate of flow of the heat medium in the heat medium passage 5 for thereby keeping the reactor wall and the reaction chamber 3 at the predetermined temperature.

A reactant gas ejector head 6 for ejecting a mixture of a material gas and an oxide gas into the reaction chamber 3 is mounted in the upper end of the reactor 1. The reactant gas ejector head 6 is connected through gas inlet pipes 27 to a gas supply G (see FIG. 2). The support base 2 has a vertical sleeve 7 disposed around a central opening defined therein and projecting upwardly from the support base 2. The vertical sleeve 7 also has a heat medium passage 5 defined therein for circulating a heat medium therethrough. The heat medium passage 5 is connected to a reaction chamber cooling device H (see FIG. 2).

A susceptor (substrate stage) 8 for supporting a substrate S thereon is disposed in the vertical sleeve 7. The susceptor 8 comprises a hollow disk-shaped member made of a material whose thermal conductivity is not largely different from the thermal conductivity of the substrate S. The susceptor 8 has a recess 8a on its upper end for holding the edge of the substrate S. The susceptor 8 is rotatably supported by a motor 9, combined with magnetic bearings, disposed underneath the support base 2.

The motor 9 is housed in a tubular casing 10 attached to and projecting downwardly from a lower surface of the support base 2. The motor 9 comprises a vertical hollow central rotor 11 and a stator 12 located in the tubular casing 10 around the rotor 11. The rotor 11 has a plurality of vertically spaced disks D of a magnetic material which project radially outwardly. The stator 12 has a plurality of control coils C positioned in confronting relation to the respective disks D. The control coils C are supplied with a control current from a controller B (see FIG. 2). The motor 9 also has an upper radial magnetic bearing 13, a motor unit 14, a lower radial magnetic bearing 15, and an axial magnetic bearing 16, which are arranged successively downwardly in the order named. The motor 9 further includes sensors (not shown) disposed in respective positions for detecting a gap dimension and an angle of inclination, and an encoder 17 disposed in a lowermost position for detecting the rotational speed of the motor 9. Output signals from these sensors and the encoder 17 are supplied to the controller B. The rotor 11 projects upwardly into the reaction chamber 3 through the central opening in the support base 2, and has a susceptor table 20 on its upper end which comprises a horizontal bottom plate 18 and a vertical cylindrical side wall 19 projecting upwardly from the horizontal bottom plate 18.

The casing 10 has a bottom base 21 on its lower end. A vertical column 22 is mounted on the bottom base 21 and projects upwardly through the rotor 11 into the susceptor table 20. The vertical column 22 supports on its upper end a heater support 24 which supports a heater 23 beneath the substrate S. A thermocouple 25 for measuring the temperature of the heater 23 is positioned beneath the heater 23. The heater 23 and the thermocouple 25 are electrically connected to a substrate temperature controller 33 (see FIG. 2) through electric wires 26 which extend through the vertical column 22.

As shown in FIG. 2, a robot chamber 37 is connected through a gate valve 36 to the reaction chamber 3, and a second chamber 39 is connected to the robot chamber 37 through a gate valve 38. The robot chamber 37 is combined with a substrate feed robot 40 having an arm (not shown) which is linearly and angularly movable in the robot chamber 37 for gripping and feeding a substrate into and out of the reaction chamber 3.

Operation of the thin-film vapor deposition apparatus A, according to the first embodiment of the present invention will be described below.

Based on the temperature of the substrate S or the heater 23 which is measured by the thermocouple 25, the substrate temperature controller 33 controls the temperature of the substrate S at 550° C.±1%, for example. The heater 23, when energized, heats the lower surface of the substrate S by way of radiation. In order to control the temperature of reactant gases in the reaction chamber 3, the temperature and the rate of flow of the heat medium flowing through the heat medium passage 5 in the reactor 1 are controlled by the reaction chamber heating device F. In this manner, the temperature of the inner wall of the reactor 1 is adjusted to 250~260° C.±2%. At the same time, the temperature and the rate of flow of the heat medium flowing through the heat medium passage 5 in the vertical sleeve 7 are controlled by the reaction chamber cooling device H.

The motor 9 is energized to rotate the susceptor 8 and hence the substrate S is rotated thereon at high speed. Based on detected signals from the sensors and the encoder 17, the controller B supplies control signals to the magnetic bearings 13, 15, 16 and the motor 9 to control the rotational speed and attitude of the susceptor 8. Since the rotor 11 is hollow, it is light in weight and high in mechanical strength. The rotor 11 can stably and smoothly be controlled on account of its low natural frequency.

A thin film is deposited on the substrate S while the temperatures of the reaction chamber 3 and the substrate S are being individually controlled and the substrate S is being smoothly rotated at high speed. Specifically, a metal material gas and an oxygen-containing gas such as ozone ($O_3$) are introduced from the gas supply G through the gas inlet pipes 27 into the reactant gas ejector head 6, in which the gases are mixed together. The metal material gas and the oxygen-containing gas are then ejected from the reactant gas ejector head 6 through a nozzle (not shown) into the reaction chamber 3. In the reaction chamber 3, the metal material gas and the oxygen-containing gas react with each other, producing molecules of a metal oxide such as barium titanate or strontium titanate, which are deposited as a thin film of metal oxide on the substrate S, which may be a semiconductor wafer.

After the substrate S has been processed, the gate valve 36 is opened, and the arm of the substrate feed robot 40 enters into reaction chamber 3 and picks up the substrate S. The substrate feed robot 40 is retracted into the robot chamber 37, and the gate valve 36 is closed. The gate valve 38 is opened, the substrate feed robot 40 is retracted into the second chamber 39, and then the gate valve 38 is closed. The substrate S carried by the substrate feed robot 40 is unloaded. The substrate feed robot 40 picks up a new substrate S, carries the new substrate S through the robot chamber 37 into the reaction chamber 3, and then places the new substrate S on the susceptor 8.

In the thin-film vapor deposition apparatus $A_1$, since the temperature of the inner wall of the reactor 1 and also the temperature of the vertical sleeve 7 are controlled, the temperature of the atmosphere in the reaction chamber 3 can be controlled precisely. The temperature of the substrate S is also accurately controlled because the substrate S is directly heated by the heater 23. Accordingly, a high-quality thin film of a high dielectric constant material can smoothly and accurately be deposited on the substrate S though such a high dielectric constant material in a vapor phase needs to be kept in a very narrow temperature range and the gases react in a narrow temperature range. The thin film is deposited highly efficiently on the substrate S because the substrate S is rotated at high speed by the motor 9.

Since the rotor 11 is hollow, light in weight, and has a lower natural frequency than if it were solid, the rotor 11 is resistant to abnormal vibration and can easily be controlled for its rotation. Inasmuch as the heater 23 is disposed in a space surrounded by the susceptor table 20 behind the substrate S, the heater 23 is prevented from being contaminated by the gases in the reaction chamber 3 and also from contaminating the gases in the reaction chamber 3. Furthermore, an electric supply system including the electric wires 26 is relatively simple and trouble-free because the heater 23 and the thermocouple 25 are not required to be electrically connected through slip rings.

Figure 3:
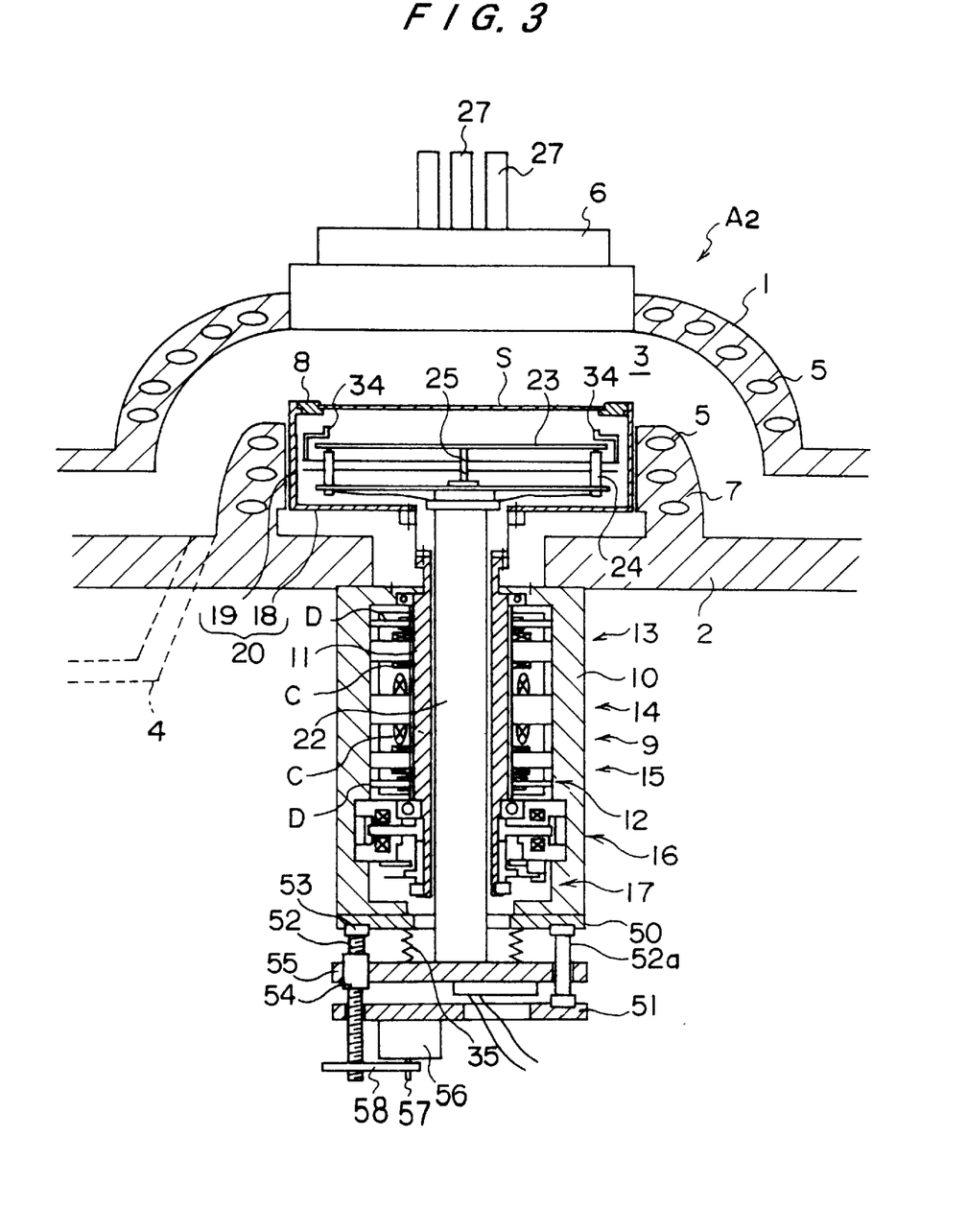
FIG. 3 is a schematic vertical cross-sectional view of a thin-film vapor deposition apparatus according to a second embodiment of the present invention.

FIG. 3 shows a thin-film vapor deposition apparatus $A_2$ according to a second embodiment of the present invention.

The thin-film vapor deposition apparatus $A_2$ according to the second embodiment differs from the thin-film vapor deposition apparatus $A_1$ according to the first embodiment in that the heater 23 for heating the substrate S is vertically movable. Only those parts of the thin-film vapor deposition apparatus $A_2$ according to the second embodiment which differ from those of the thin-film vapor deposition apparatus $A_1$ according to the first embodiment will be described in detail below.

A horizontal bolt support plate 51 is spaced downwardly from a bottom plate 50 of the casing 10, and a plurality of vertical bolts 52 are rotatably supported between the bolt support plate 51 and the bottom plate 50 by bearings 53. The vertical bolts 52 extend through a horizontal movable plate 55 disposed between the bolt support plate 51 and the bottom plate 50. One of the bolts 52 is held in threaded engagement with nuts 54 fixedly supported on the horizontal movable plate 55. The bolt 52 and the nuts 54 threadedly engage each other through balls, and hence jointly make up a ball screw mechanism which minimizes wear and play between the bolt 52 and the nuts 54. A drive motor 56 is mounted on a lower surface of the horizontal bolt support plate 51 and has an output shaft 57 operatively connected through a power transmitting mechanism 58 to the bolt 52 which threadedly engages the nuts 54. Therefore, when the drive motor 56 is energized, the movable plate 55 is vertically moved. A guide bar 52a arranged between the bolt support plate 51 and the bottom plate 50 smoothly guides the movable plate therealong.

A bellows 35 is disposed between the movable plate 55 and the bottom plate 50 around the column 22 for isolating the space in the casing 10 which communicates with the reaction chamber 3 from the ambient space.

Vertical column 22 is mounted on the movable plate 55 and projects upwardly through the bottom plate 50, the rotor 11 into the susceptor table 20. The vertical column 22 supports on its upper end the heater support 24 which supports the heater 23 immediately below the substrate S. A thermocouple 25 for measuring the temperature of the heater 23 is positioned beneath the heater 23. The heater 23 and the thermocouple 25 are electrically connected to the substrate temperature controller 33 (see FIG. 2) through electric wires which extend through the vertical column 22.

The heater support 24 has four substrate pusher pins 34 projecting upwardly for pushing the substrate S off the susceptor 8.

The thin-film vapor deposition apparatus $A_2$ operates as follows:

The process of depositing a thin film on the substrate S in the thin-film vapor deposition apparatus $A_2$ is the same as the process of depositing a thin film on the substrate S in the thin-film vapor deposition apparatus $A_1$. After one substrate S has been processed, the drive motor 56 is energized to lift the movable plate 55 and the heater support 24. The substrate pusher pins 34 are elevated to lift the substrate S off the susceptor 8. Then, the gate valve 36 (see FIG. 2) is opened, and the arm of the substrate feed robot 40 enters into the gap between the susceptor 8 and the substrate S. Then, the drive motor 56 is reversed to lower the movable plate 55, placing the substrate S on the arm of the substrate feed robot 40. The substrate feed robot 40 is retracted into the robot chamber 37, and the gate valve 36 is closed. The gate valve 38 is opened, the substrate feed robot 40 is retracted into the second chamber 39, and then the gate valve 38 is closed. The substrate S carried by the substrate feed robot 40 is unloaded. The substrate feed robot 40 carries a new substrate S, carries the new substrate S through the robot chamber 37 into the reaction chamber 3, and then places the new substrate S on the susceptor 8.

Figure 4:
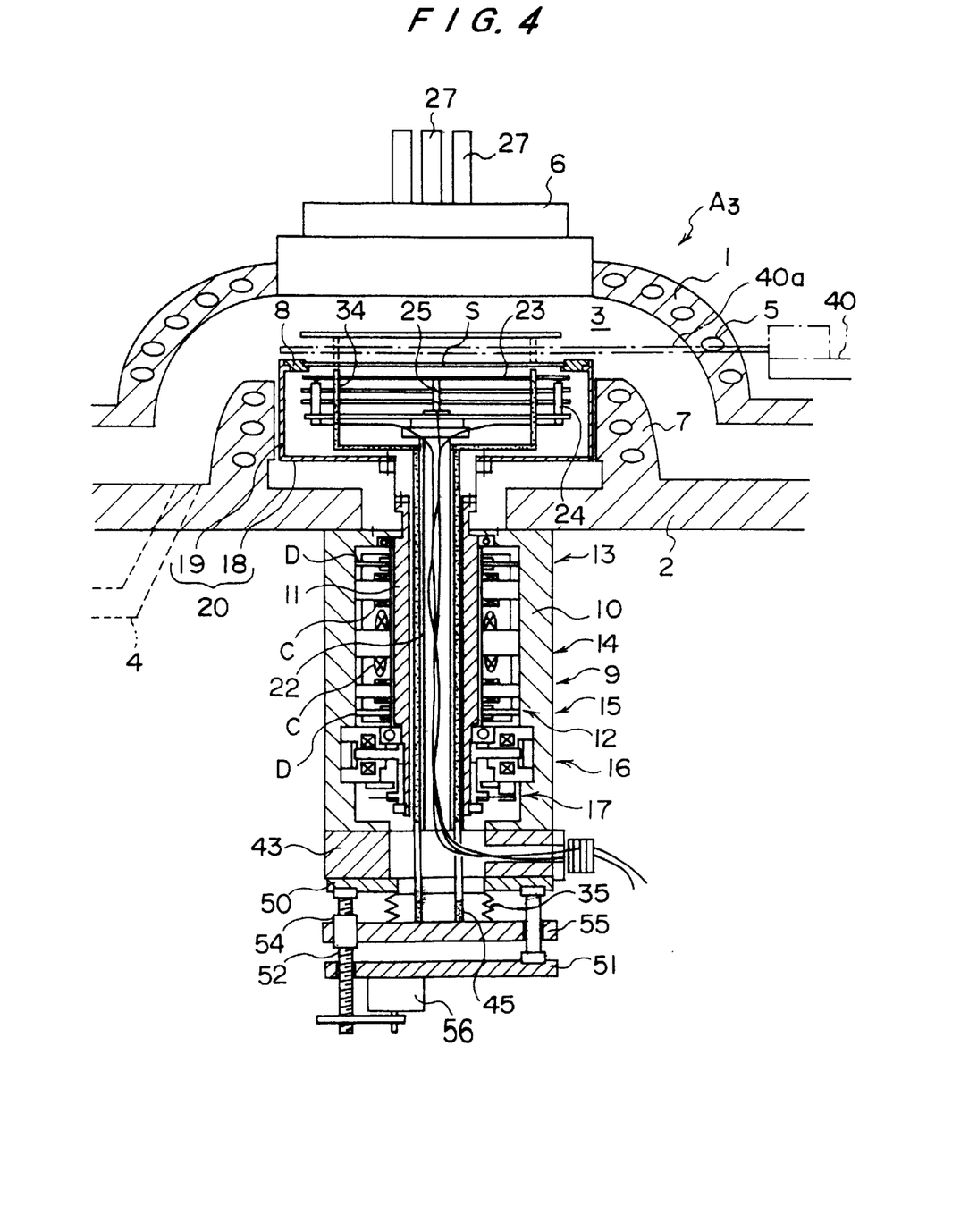
FIG. 4 is a schematic vertical cross-sectional view of a thin-film vapor deposition apparatus according to a third embodiment of the present invention.
Figure 5:
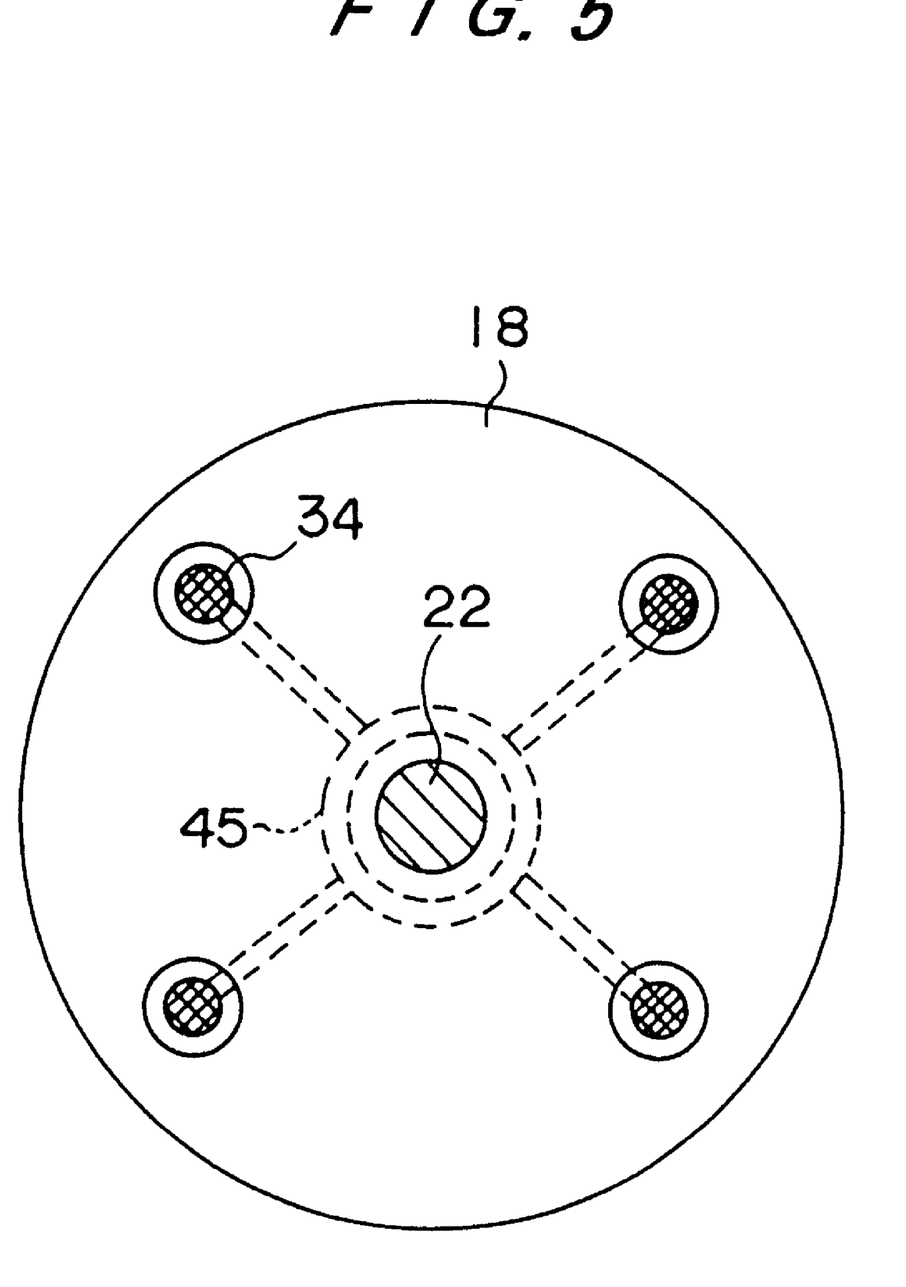
FIG. 5 is a horizontal cross-sectional view of the thin-film vapor deposition apparatus according to the third embodiment of the present invention.

FIGS. 4 and 5 show a thin-film vapor deposition apparatus $A_3$ according to a third embodiment of the present invention.

The thin-film vapor deposition apparatus $A_3$ according to the third embodiment differs from the thin-film vapor deposition apparatus $A_2$ according to the second embodiment in that the substrate pusher pins 34 are vertically movable independently of the heater 23. Only those parts of the thin-film vapor deposition apparatus $A_3$ according to the third embodiment which differ from those of the thin-film vapor deposition apparatus $A_2$ according to the second embodiment will be described in detail below.

A fixed plate 43 is attached to the lower end of the casing 10, and the column 22 extending vertically through the rotor 11 is mounted on the fixed plate 43. The heater support 24 is mounted on the upper end of the column 22. The movable plate 55 is vertically movably connected to the bottom plate 50 through the ball screw mechanism. The movable plate 55 supports thereon a vertical cylindrical coupling 45 which extends upwardly through the fixed plate 43 and surrounds the column 22. The substrate pusher pins 34 are supported on the upper end of the vertical cylindrical coupling 45. The vertical cylindrical coupling 45 and the fixed plate 43 have respective recesses defined therein in a region where they cross each other. These recesses allow the vertical cylindrical coupling 45 and the fixed plate 43 to avoid physical interference with other.

The process of depositing a thin film on the substrate S in the thin-film vapor deposition apparatus $A_3$ is the same as the process of depositing a thin film on the substrate S in the thin-film vapor deposition apparatus $A_2$. After the substrate S has been processed, the heater 23 is not lifted, but only the substrate pusher pins 34 are elevated. Since the heater 23 remains in a low position away from the substrate S, the heater 23 does not heat the arm 40*a* of the substrate feed robot 40. Specifically, when one film deposition cycle is finished, the heater 23 is turned off. However, since the temperature of the heater 23 is not quickly lowered, the heater 23 would tend to heat the arm 40*a* of the substrate feed robot 40 if the heater 23 were lifted together with the substrate pusher pins 34. According to the third embodiment, inasmuch as the heater 23 remains in its low position away from the substrate S when the substrate pusher pins 34 are lifted, the arm 40*a* of the substrate feed robot 40 is not unduly heated by the heater 23.

Figure 6:
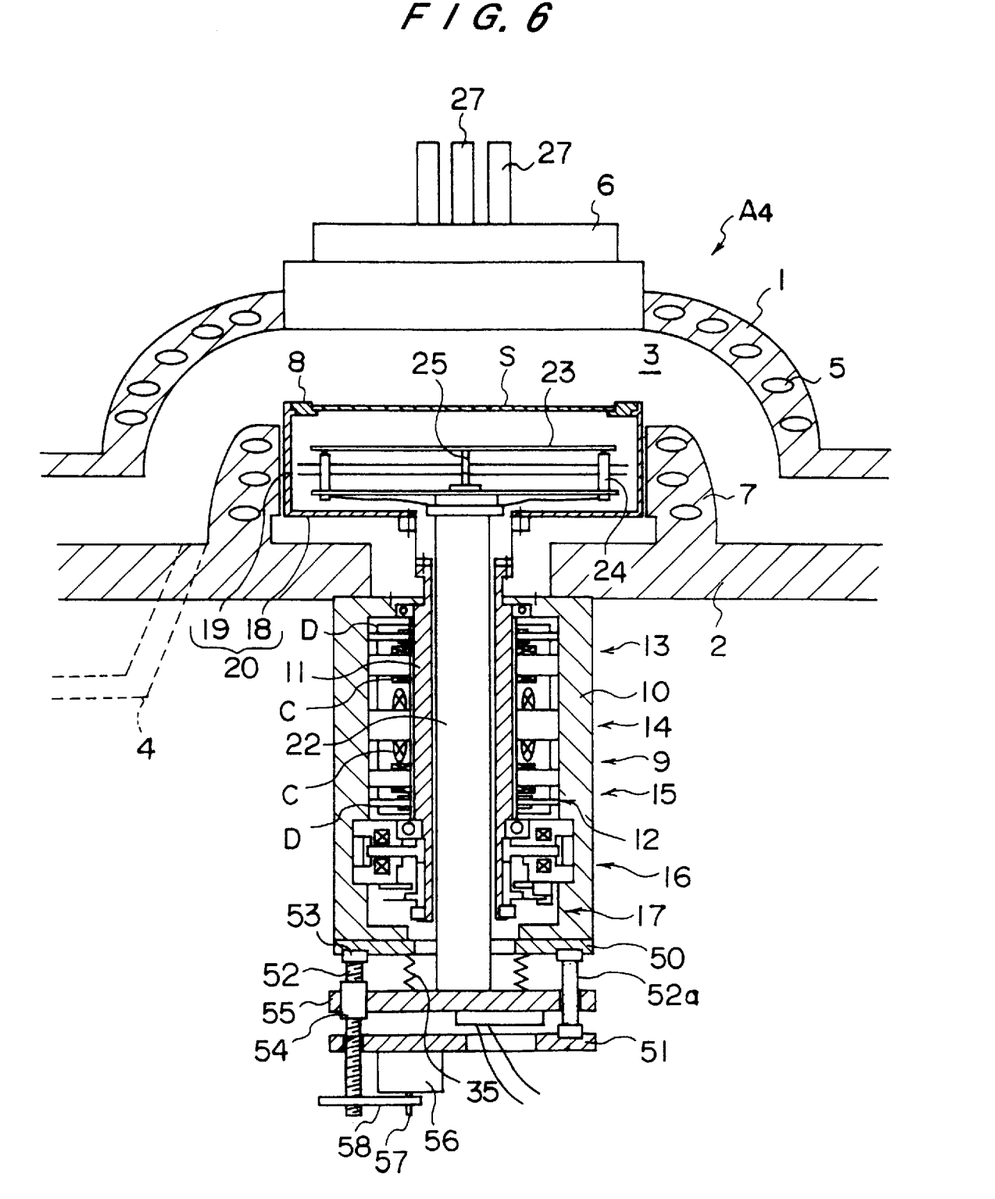
FIG. 6 is a schematic vertical cross-sectional view of a thin-film vapor deposition apparatus according to a fourth embodiment of the present invention.

FIG. 6 shows a thin-film vapor deposition apparatus $A_4$ according to a fourth embodiment of the present invention.

The thin-film vapor deposition apparatus $A_4$ according to the fourth embodiment of the present invention differs from the thin-film vapor deposition apparatus $A_2$ according to the second embodiment of the present invention in that the thin-film vapor deposition apparatus $A_4$ has no substrate pusher pins and controls the temperature of the substrate S by vertically moving the heater support 24. In the thin-film vapor deposition apparatus $A_4$, the temperature of the substrate S is controlled at 550° C.±1%, for example, by the substrate temperature controller 33 (see FIG. 2), as follows: First, the substrate temperature controller 33 supplies the heater 23 with such an electric current that the temperature of the surface of the heater 23 is of a constant value which is higher than 550° C. by a certain value. The temperature of the surface of the heater 23 may be controlled through feedback control based on the temperature of the heater 23 measured by the thermocouple 25 or may simply be set to the desired value which has been determined in advance depending on the characteristics of the heater 23.

Thereafter, the temperature in the vicinity of the surface of the substrate S is measured by the thermocouple 25, and compared with a predetermined value. If the measured temperature is higher than the predetermined value, then the drive motor 56 is energized to lower the heater 23. If the measured temperature is lower than the predetermined value, then the drive motor 56 is energized to lift the heater 23. At this time, if the electric current supplied to the heater 23 is judged as being excessively large in view of the relative positional relationship of the substrate S and the heater 23, then the electric current may also be controlled at the same time. In the above illustrated embodiment, the measured temperature of the thermocouple 25 is used as a parameter. Another parameter, e.g., the progressive state of the reaction in the reaction chamber 3 may be used as a parameter instead of or together with the measured temperature of the thermocouple 25.

In order to control the temperature of reaction gases in the reaction chamber 3, the temperature and the rate of flow of the heat medium flowing through the heat medium passage 5 in the reactor 1 are controlled by the reaction chamber heating device F (see FIG. 2). In this manner, the temperature of the inner wall of the reactor 1 is controlled to be within a range of 250~260° C.±2%, for example.

The motor 9 is energized to rotate the susceptor 8 and hence the substrate S supported thereon at high speed. Based on detected signals from the sensors and the encoder 17, the controller B supplies control signals to the magnetic bearings 13, 15, 16 and the motor 9 to control the rotational speed and attitude of the susceptor 8. Since the rotor 11 is hollow, it is light in weight and high in mechanical strength. The rotor 11 can stably and smoothly be controlled on account of its low natural frequency.

A thin film is deposited on the substrate S while the temperatures of the reaction chamber 3 and the substrate S are being individually controlled and the substrate S is being smoothly rotated at high speed. The heater 23, when energized, heats the lower surface of the substrate S by way of radiation. Because the amount of heat applied from the heater 23 to the substrate S varies largely depending on the distance between the heater 23 and the substrate S, the temperature of the substrate S can be controlled more quickly and strictly than if only the temperature of the heater 23 were controlled. The strict temperature control of the substrate S allows high-quality thin films of a high dielectric constant material to be produced with a high yield though the high dielectric constant material in a vapor phase needs to be kept in a narrow temperature range.

Although certain preferred embodiments of the present invention have been shown and described in detail, it should be understood that various changes and modifications may be made therein without departing from the scope of the appended claims.

What is claimed is:

1. A thin-film vapor deposition apparatus comprising:

a reaction chamber for holding therein a substrate in an atmosphere isolated from an ambient atmosphere;

substrate rotating means for rotating at a high speed the substrate in said reaction chamber, said rotating means comprising a hollow rotor rotatably supported by a magnetic bearing device and having an end projecting into said reaction chamber, and a substrate support member mounted on said end of said rotor for supporting the substrate;

a reactant gas supply device for ejecting a reactant gas toward the substrate supported on said support member for depositing a thin film on the substrate;

reaction chamber temperature control means for adjusting the temperature of an inner wall of said reaction chamber;

substrate temperature control means for controlling the temperature of the substrate; and an evacuation device for evacuating gases from said reaction chamber.

2. An apparatus as claimed in claim 1, wherein said substrate temperature control means comprises a column extending through said hollow rotor, and a heater mounted on an end of said column in confronting relationship to the substrate.

3. An apparatus as claimed in claim 1, wherein said substrate support member supports the substrate while leaving uncovered at least a portion of a rear side thereof remote from said reactant gas supply device.

4. A thin-film vapor deposition apparatus comprising:

a reaction chamber for holding therein a substrate in an atmosphere isolated from an ambient atmosphere;

a substrate support member for supporting the substrate in said reaction chamber;

substrate rotating means for rotating at a high speed the substrate in said reaction chamber, said rotating means including a hollow rotor;

a substrate pusher member for pushing the substrate off said substrate support member;

a heater disposed in confronting relation to a reverse side of the substrate for heating the substrate;

said pusher member and said heater being movable in unison with each other toward and away from the substrate;

a reactant gas supply device for ejecting a reactant gas toward the substrate supported on said support member for depositing a thin film on the substrate; and an evacuation device for evacuating gases from said reaction chamber.

5. An apparatus as claimed in claim 4, further comprising a coupling extending through said hollow rotor, said substrate pusher member being supported on an inner end of said coupling within said reaction chamber, and an actuating mechanism mounted on an outer end of said coupling outside of said reaction chamber for moving said coupling toward and away from said reaction chamber.

6. An apparatus as claimed in claim 5, wherein said actuating mechanism comprises a feed screw mechanism.

7. An apparatus as claimed in claim 5, further comprising a cover member covering said coupling and flexible upon movement of said coupling, said cover member isolating a space communicating with said reaction chamber from the ambient atmosphere.

8. A thin-film vapor deposition apparatus comprising:

a reaction chamber for holding therein a substrate in an atmosphere isolated from an ambient atmosphere;

a substrate support member for supporting the substrate in said reaction chamber;

substrate rotating means for rotating at a high speed the substrate in said reaction chamber, said rotating means including a hollow rotor;

a heater disposed in confronting relation to an entire surface of a reverse side of the substrate for heating the substrate;

a heater moving mechanism extending through said hollow rotor for supporting said heater and for moving said heater toward and away from the reverse side of the substrate;

a reactant gas supply device for ejecting a reactant gas toward the substrate supported on said support member for depositing a thin film on the substrate; and an evacuation device for evacuating gases from said reaction chamber.

9. An apparatus as claimed in claim 8, wherein said substrate support member supports the substrate while leaving uncovered at least a portion of the reverse side thereof.

10. An apparatus as claimed in claim 8, wherein said heater moving mechanism comprises a feed screw mechanism.

11. An apparatus as claimed in claim 8, further comprising a cover member covering a space between said hollow rotor and said heater moving mechanism and flexible upon movement of said heater, said cover member isolating a space communicating with said reaction chamber from the ambient atmosphere.

12. An apparatus as claimed in claim 8, further comprising reaction chamber temperature adjusting means for adjusting the temperature of an inner wall of said reaction chamber.

* * * * *